(12) United States Patent
Watanabe

(10) Patent No.: US 10,896,510 B2
(45) Date of Patent: Jan. 19, 2021

(54) IMAGE PROCESSING APPARATUS, IMAGE PROCESSING METHOD, AND PROGRAM

(71) Applicant: Sony Interactive Entertainment Inc., Tokyo (JP)

(72) Inventor: Shin Watanabe, Kanagawa (JP)

(73) Assignee: SONY INTERACTIVE ENTERTAINMENT INC., Tokyo (JP)

( * ) Notice: Subject to any disclaimer, the term of this patent is extended or adjusted under 35 U.S.C. 154(b) by 136 days.

(21) Appl. No.: 16/155,003

(22) Filed: Oct. 9, 2018

(65) Prior Publication Data

US 2019/0130577 A1 May 2, 2019

(30) Foreign Application Priority Data

Nov. 2, 2017 (JP) ................................. 2017-212536

(51) Int. Cl.

| | | |
|---|---|---|
| *G06K 9/34* | (2006.01) | |
| *G06T 7/149* | (2017.01) | |
| *G06T 7/12* | (2017.01) | |
| *H04N 1/32* | (2006.01) | |
| *H04N 1/00* | (2006.01) | |
| *H04N 1/60* | (2006.01) | |
| *G06T 17/20* | (2006.01) | |
| *G06F 17/10* | (2006.01) | |
| *G06F 30/20* | (2020.01) | |

(52) U.S. Cl.
CPC ............. *G06T 7/149* (2017.01); *G06F 17/10* (2013.01); *G06F 30/20* (2020.01); *G06T 7/12* (2017.01); *G06T 17/20* (2013.01); *H04N 1/00225* (2013.01); *H04N 1/32358* (2013.01); *H04N 1/603* (2013.01); *G06T 2210/21* (2013.01)

(58) Field of Classification Search
CPC ............ G06T 7/149; G06T 17/20; G06T 7/12; G06T 2210/21; G06F 30/20; G06F 17/10; H04N 1/32358; H04N 1/00225; H04N 1/603

See application file for complete search history.

(56) References Cited

U.S. PATENT DOCUMENTS

| | | | | |
|---|---|---|---|---|
| 8,416,245 B2 * | 4/2013 | Bond | ...................... | G06T 13/00 345/473 |
| 9,171,390 B2 * | 10/2015 | Sumner | ................... | G06T 13/00 |

OTHER PUBLICATIONS

Fast tetrahedron-tetrahedron overlap algorithm; F. Ganovelli, F. Ponchio and C. Rocchini; Aug. 11, 2002.

* cited by examiner

*Primary Examiner* — Dhaval V Patel
(74) *Attorney, Agent, or Firm* — Katten Muchin Rosenman LLP

(57) ABSTRACT

Disclosed herein is an image processing apparatus including: a position acquisition section configured to acquire a position of a first tetrahedron and a position of a second tetrahedron; a separational axis acquisition section configured to acquire a separational axis extending in a direction from the first tetrahedron to the second tetrahedron; a technique selection section configured to project a vertex of the first tetrahedron and a vertex of the second tetrahedron on the separational axis and select a calculation technique for a contact point on a basis of an order in which the projected vertex of the first tetrahedron and vertex of the second tetrahedron align on the separational axis; a contact point calculation section configured to calculate one or a plurality of contact points between the first tetrahedron and the second tetrahedron by the selected calculation technique; and an image drawing section configured to draw an image.

10 Claims, 9 Drawing Sheets

Vertex vs Face

Edge vs Edge

FIG. 9C
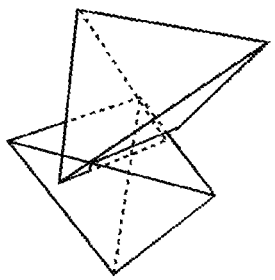
Edge vs Face
FIG. 9D
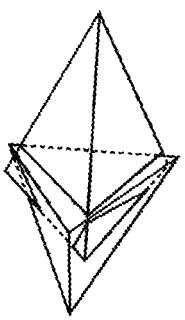
Face vs Face
FIG. 10A
11100100
FIG. 10B
10110100

FIG. 11

```
11110000 | No Collision
11101000 | Vertex vs Vertex
11011000 | Vertex vs Edge
10111000 | Vertex vs Face
01111000 | Vertex vs Face
11100100 | Edge vs Vertex
11010100 | Edge vs Edge
10110100 | Edge vs Face
01110100 | Edge vs Face
11001100 | Edge vs Edge
10101100 | Edge vs Face
01101100 | Edge vs Face
10011100 | Edge vs Face
01011100 | Edge vs Face
00111100 | Edge vs Face
11100010 | Face vs Vertex
11010010 | Face vs Edge
10110010 | Face vs Face
01110010 | Face vs Face
11001010 | Face vs Edge
10101010 | Face vs Face
01101010 | Face vs Face
10011010 | Face vs Face
01011010 | Face vs Face
00111010 | Face vs Face
11000110 | Face vs Edge
10100110 | Face vs Face
01100110 | Face vs Face
10010110 | Face vs Face
01010110 | Face vs Face
00110110 | Face vs Face
10001110 | Face vs Face
01001110 | Face vs Face
00101110 | Face vs Face
00011110 | Face vs Face
```

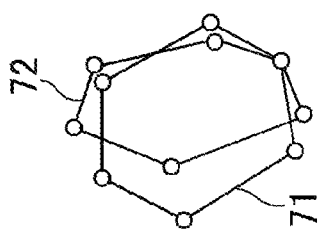
FIG. 12C
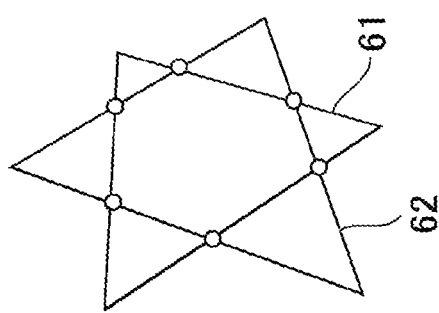
FIG. 12B
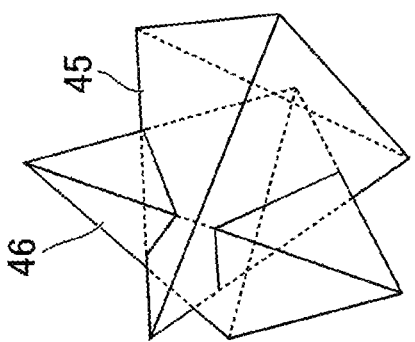
FIG. 12A

IMAGE PROCESSING APPARATUS, IMAGE PROCESSING METHOD, AND PROGRAM

BACKGROUND

The present disclosure relates to an image processing apparatus, an image processing method, and a program.

In a game or the like, for example, a three-dimensional image is displayed based on a physical simulation, in general. As a portion of the physical simulation, processing for determining a collision between both polyhedrons is performed.

A technique for determining a collision between both two tetrahedrons at high speed has been disclosed in Fabio Ganovelli, Federico Ponchio and Claudio Rocchini, "Fast Tetrahedron-Tetrahedron Overlap Algorithm," Journal of Graphics Tools Volume 7, 2002, as Non-Patent Literature 1.

SUMMARY

To simulate behaviors of an object after a collision, it is necessary to find a contact point as well as determination of the presence or absence of the collision. On the other hand, it is more complicated to calculate a contact point in a collision between both any polyhedrons. To solve the above problem, the inventors have investigated that an area at least near to a surface of a polyhedron is divided into tetrahedrons and a collision between both the tetrahedrons is determined.

To calculate a contact point of both the tetrahedrons, it is generally considered that a collision between two tetrahedrons is dissolved into a collision between faces constituting the tetrahedrons and a contact point in the dissolved collision is calculated. However, in this method, a calculation amount of processing for calculating the contact point becomes more enormous and there is a limitation to speeding up.

The present disclosure has been made in view of such a subject as described above, there is a need for the present disclosure to provide a technology for calculating the contact point of both the tetrahedrons at high speed.

To solve the above problem, an image processing apparatus according to an embodiment of the present disclosure includes a position acquisition section configured to acquire a position of a first tetrahedron and a position of a second tetrahedron in a virtual space; a separational axis acquisition section configured to acquire a separational axis extending in a direction from the first tetrahedron to the second tetrahedron; a technique selection section configured to project a vertex of the first tetrahedron and a vertex of the second tetrahedron on the separational axis and select a calculation technique for a contact point on the basis of an order in which the projected vertex of the first tetrahedron and vertex of the second tetrahedron align on the separational axis; a contact point calculation section configured to calculate one or a plurality of contact points between the first tetrahedron and the second tetrahedron by the selected calculation technique; and an image drawing section configured to draw an image on the basis of the calculated contact point.

Further, an image processing method according to the embodiment of the present disclosure includes acquiring a position of a first tetrahedron and a position of a second tetrahedron in a virtual space; acquiring a separational axis extending in a direction from the first tetrahedron to the second tetrahedron; projecting a vertex of the first tetrahedron and a vertex of the second tetrahedron on the separational axis and selecting a calculation technique for a contact point on the basis of an order in which the projected vertex of the first tetrahedron and vertex of the second tetrahedron align on the separational axis; calculating one or a plurality of contact points between the first tetrahedron and the second tetrahedron by the selected calculation technique; and drawing an image on the basis of the calculated contact point.

Further, a program according to the embodiment of the present disclosure for a computer includes: by a position acquisition section, acquiring a position of a first tetrahedron and a position of a second tetrahedron in a virtual space; by a separational axis acquisition section, acquiring a separational axis extending in a direction from the first tetrahedron to the second tetrahedron; by a technique selection section, projecting a vertex of the first tetrahedron and a vertex of the second tetrahedron on the separational axis and selecting a calculation technique for a contact point on the basis of an order in which the projected vertex of the first tetrahedron and vertex of the second tetrahedron align on the separational axis; by a contact point calculation section, calculating one or a plurality of contact points between the first tetrahedron and the second tetrahedron by the selected calculation technique; and by an image drawing section, drawing an image on the basis of the calculated contact point.

According to the embodiment of the present disclosure, it is possible to calculate a contact point of both tetrahedrons at high speed.

According to the embodiment of the present disclosure, the calculation technique is provided in plurality, and the number of the calculated contact points may differ in accordance with the plurality of calculation techniques.

According to the embodiment of the present disclosure, by one of the plurality of calculation techniques, one contact point may be calculated in a collision between a vertex included in one and a face included in another of the first tetrahedron and the second tetrahedron.

According to the embodiment of the present disclosure, by one of the plurality of calculation techniques, two contact points may be calculated in a collision between an edge included in one and a face included in another of the first tetrahedron and the second tetrahedron.

According to the embodiment of the present disclosure, the separational axis acquisition section may select a separational axis from a plurality of candidates geometrically found on the basis of a shape of the first tetrahedron and a shape of the second tetrahedron.

According to the embodiment of the present disclosure, the plurality of candidates may include an axis in a direction of a normal line of a face constituting the first tetrahedron and the second tetrahedron.

According to the embodiment of the present disclosure, the plurality of candidates may include an axis in a direction vertical to an edge of the first tetrahedron and an edge of the second tetrahedron.

According to the embodiment of the present disclosure, the first tetrahedron may constitute a portion of a first object, the second tetrahedron may constitute a portion of a second object, the image processing apparatus further including a movement calculation section configured to calculate a movement of the first object and a movement of the second object on the basis of the calculated contact point, and the image drawing section may draw an image of the first object and an image of the second object on the basis of the calculated movement of the first object and that of the second object.

BRIEF DESCRIPTION OF THE DRAWINGS

FIGS. 9A to 9D are diagrams illustrating a type of collision;

FIGS. 10A and 10B are diagrams illustrating two other examples of the bit pattern;

FIG. 11 is a diagram illustrating correspondence between the bit pattern and a type of collision; and FIGS. 12A to 12C are diagrams describing an example of a calculation technique of a contact point.

DETAILED DESCRIPTION OF THE PREFERRED EMBODIMENT

Hereinafter, an embodiment of the present disclosure will be described with reference to the accompanying drawings. The same reference symbols are assigned to a component having the same function in the components appearing, and descriptions are omitted.

Figure 1:
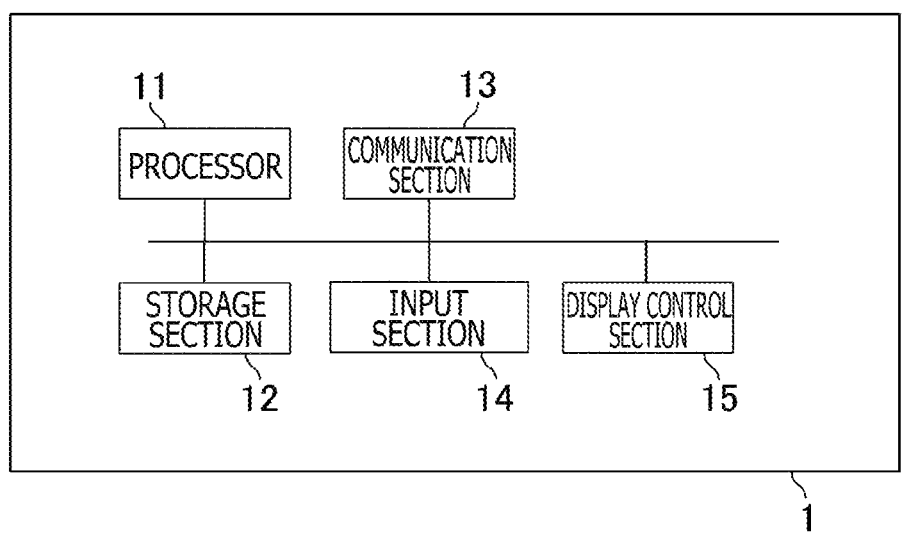
FIG. 1 is a diagram illustrating an example of a hardware configuration of an image processing apparatus according to an embodiment of the present disclosure.

FIG. 1 is a diagram illustrating an example of a hardware configuration of an image processing apparatus 1 according to the embodiment of the present disclosure. The image processing apparatus 1 is a personal computer, a home game machine, or a mobile terminal. The image processing apparatus 1 includes a processor 11, a storage section 12, a communication section 13, an input section 14, and a display control section 15.

The image processing apparatus 1 according to the present embodiment determines the presence or absence of a collision between both objects including polyhedrons, and calculates a contact point in the case in which there is a collision, in a virtual space. Further, the image processing apparatus 1 loosens constraint relating to the collision and decides movements of the objects in the calculated contact point. An image of the objects is drawn on the basis of the decided movement.

The processor 11 operates in accordance with a program stored in the storage section 12 and controls the communication section 13, the input section 14, the display control section 15, and the like. The processor 11 includes a graphic processing unit (GPU) as well as, so-called, a central processing unit (CPU). Note that the program may be stored in a computer-readable storage medium such as a flash memory to be provided or may be provided via a network such as the Internet.

The storage section 12 includes a memory device such as a dynamic random access memory (DRAM) and a flash memory. The storage section 12 stores the above-described program.

In addition, the storage section 12 stores information and computation results entered from the processor 11, the communication section 13, and the like. Note that the storage section 12 may further include a storage apparatus such as a hard disk.

The communication section 13 includes an integrated circuit, a connector, an antenna, and the like constituting a wired local area network (LAN) or a wireless LAN. The communication section 13 has a function of providing communication with other apparatuses via a network. Under the control of the processor 11, the communication section 13 enters information received from other apparatuses into the processor 11 or the storage section 12 and transmits the information to other apparatuses.

The input section 14 is a circuit configured to acquire inputs from the hardware that detects operations done by a user. The input section 14 acquires an input signal from an input device such as a keyboard and a controller, and enters information to which the input signal is converted to the processor 11 or the storage section 12.

The display control section 15 includes a circuit configured to control a display output device such as a display apparatus or a head-mounted display. Under the control of the processor 11, the display control section 15 allows the display output device to display an image.

Figure 2:
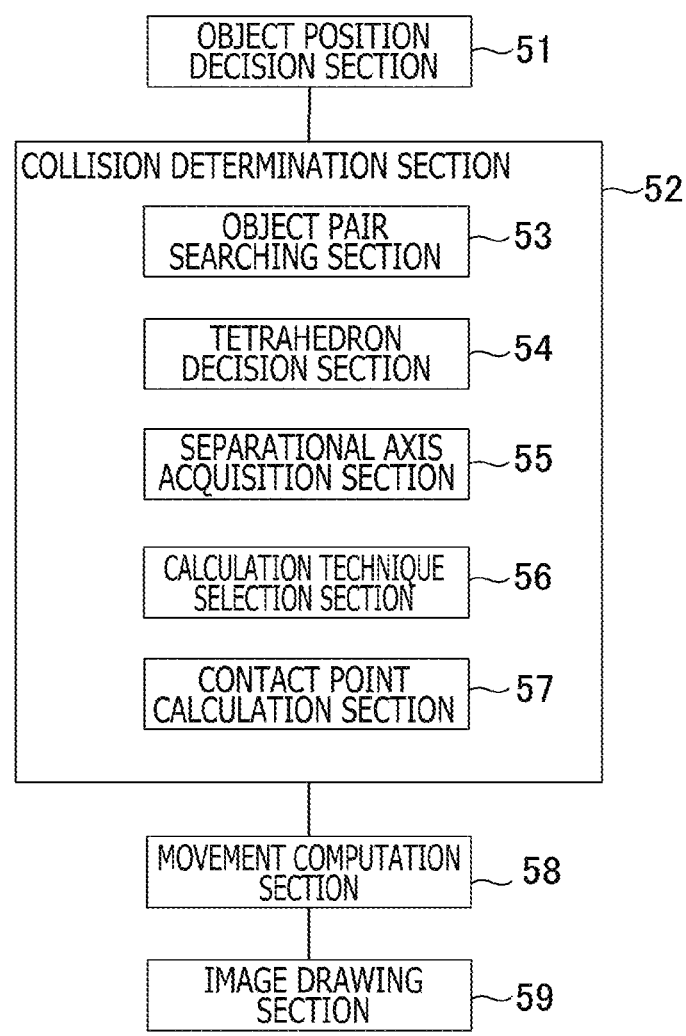
FIG. 2 is a block diagram illustrating functions to be implemented by the image processing apparatus.

Next, functions and processing implemented by the image processing apparatus 1 will be described. FIG. 2 is a block diagram illustrating the functions implemented by the image processing apparatus 1. The image processing apparatus 1 functionally includes an object position decision section 51, a collision determination section 52, a movement computation section 58, and an image drawing section 59. The collision determination section 52 functionally includes an object pair searching section 53, a tetrahedron decision section 54, a separational axis acquisition section 55, a calculation technique selection section 56, and a contact point calculation section 57.

The object position decision section 51 is mainly implemented by executing a program stored in the storage section 12, acquiring an operation of the user via the input section 14, processing information, and storing a processing result in the storage section 12 by the processor 11. The collision determination section 52 and the movement computation section 58 are mainly implemented by executing a program stored in the storage section 12, processing information stored in the storage section 12 or the like, and storing the processing result in the storage section 12 by the processor 11. The image drawing section 59 is mainly implemented by executing a program stored in the storage section 12, processing the information stored in the storage section 12 or the like, and controlling the display control section 15 so that the display output device displays an image, by the processor 11.

The object position decision section 51 acquires a signal from the input device acquired via the input section 14. Further, the object position decision section 51 calculates positions of a plurality of objects in the virtual space in this frame on the basis of the acquired signal and positions and movements of the plurality of objects in the virtual space in the previous frame.

The collision determination section 52 determines whether or not the plurality of objects in which tentative positions are calculated collide with each other and calculates a contact point of two objects that collide with each other.

Figure 4:
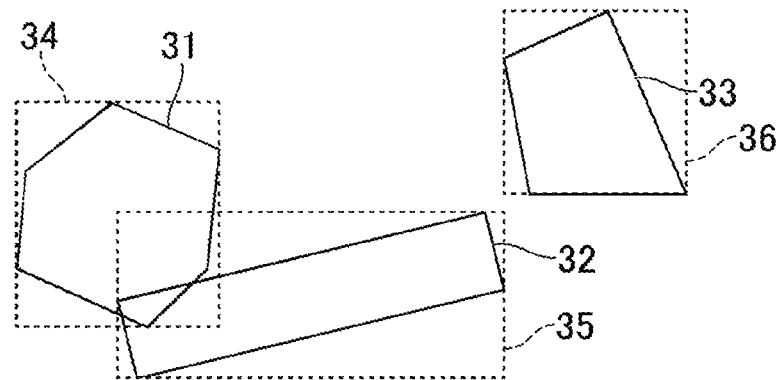
FIG. 4 is a diagram illustrating an example of an object subjected to collision determination.

The object pair searching section 53 searches a combination of a first object 31 and a second object 32 mutually having a possibility of a collision on the basis of the tentative positions obtained by calculating each of the plurality of objects that are arranged in the virtual space (see FIG. 4). The searched combination of the objects is a target processed by the tetrahedron decision section 54, the separational axis acquisition section 55, the calculation technique selection section 56, the contact point calculation section 57, and the movement computation section 58.

The tetrahedron decision section 54 decides a tetrahedron subjected to follow-on processing with respect to individually the first object 31 and the second object 32 constituting the searched combination. Here, each object has a plurality of polygons constituting an outer shape and further includes a plurality of tetrahedrons for contact determination. The plurality of tetrahedrons for contact determination are formed so as to constitute at least a surface of an object and a space in which a tetrahedron is not formed inside the object may be present. Further, the object may be a rigid body.

Figure 6:
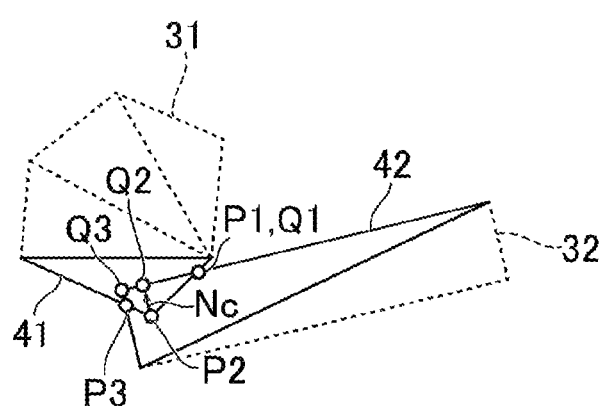
FIG. 6 is a diagram illustrating a tetrahedron for contact determination.

More specifically, the tetrahedron decision section 54 decides a first tetrahedron 41 and a second tetrahedron 42 having the possibility of a collision from among the plurality of tetrahedrons constituting the first object 31 and the second object 32 (see FIG. 6). Here, the tetrahedron decision section 54 selects the first tetrahedron 41 from among the plurality of tetrahedrons constituting the first object 31 and selects the second tetrahedron 42 from among the plurality of tetrahedrons constituting the second object 32.

The separational axis acquisition section 55 determines whether or not the first tetrahedron 41 and the second tetrahedron 42 collide with each other. Further, the separational axis acquisition section 55 acquires a separational axis As. The separational axis As is an axis in a direction in which in the collision determination, the first tetrahedron 41 and the second tetrahedron 42 are projected on the separational axis As and thereby it can be determined whether or not the first tetrahedron 41 and the second tetrahedron 42 collide with each other. Further, the separational axis As extends in the direction from the first tetrahedron 41 to the second tetrahedron 42.

The calculation technique selection section 56 projects vertexes of the first tetrahedron 41 and vertexes of the second tetrahedron 42 on the separational axis As. Then, the calculation technique selection section 56 selects a calculation technique for the contact point on the basis of an order in which the projected vertexes of the first tetrahedron 41 and the projected vertexes of the second tetrahedron 42 align on the separational axis As. Here, the number of the calculated contact points differs in accordance with the calculation technique for the contact point. Among the calculation techniques, there is used even the calculation technique such that the number of the contact points calculated with respect to one of the first tetrahedron 41 and the second tetrahedron 42 is one. Further, there is used even the calculation technique such that the number of the calculated contact points is three or more. Details of the calculation technique for the contact point will be described below.

The contact point calculation section 57 calculates one or a plurality of contact points of the first tetrahedron 41 and the second tetrahedron 42 by using the selected calculation technique.

On the basis of the calculated contact points, the movement computation section 58 calculates movements of objects including the objects that collide with each other and decides positions and postures of the objects in this frame. With respect to the first object 31 and the second object 32 that collide with each other, the movement computation section 58 sets constraint conditions according to the collision to each of the calculated contact points, and calculates movements of the first object 31 and the second object 32 by loosening the constraint conditions.

The image drawing section 59 draws an image of their objects on the basis of the calculated movement of each object.

Figure 3:
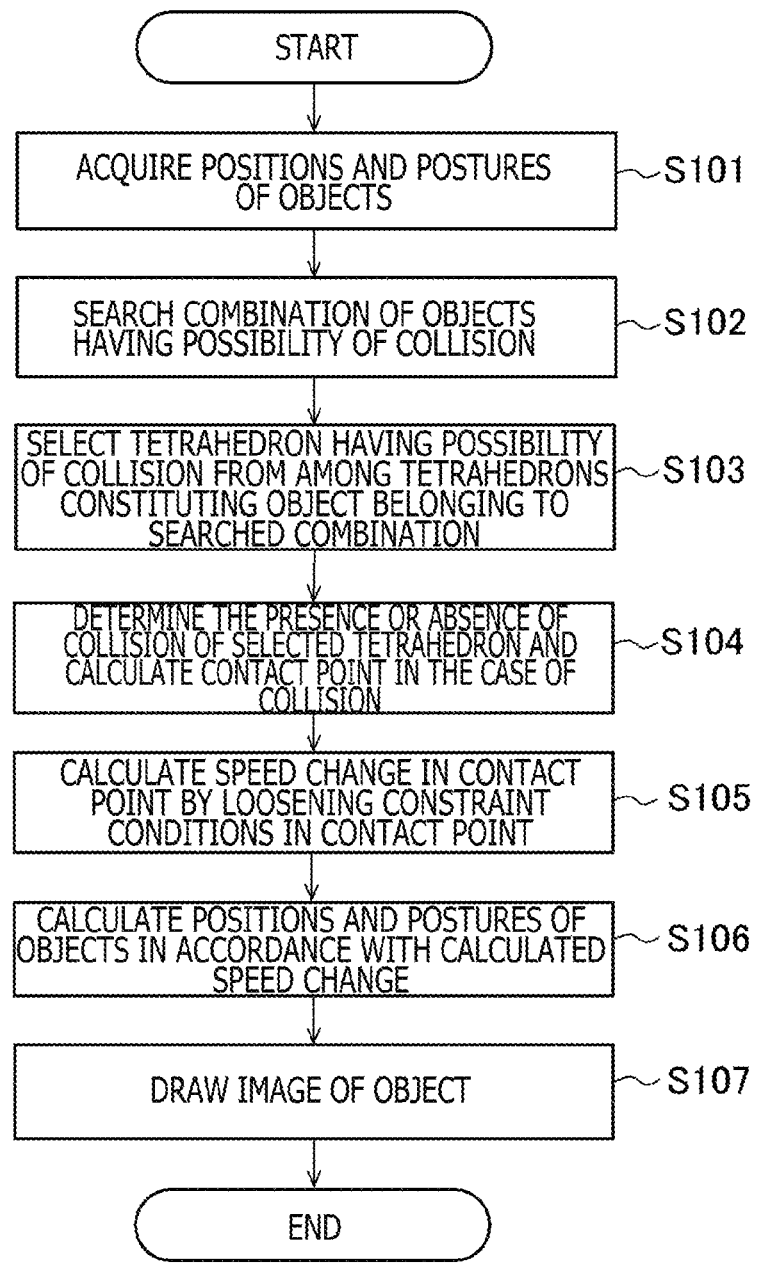
FIG. 3 is a flow chart schematically illustrating processing to be performed by the image processing apparatus.

FIG. 3 is a flow chart schematically illustrating the processes performed by the image processing apparatus 1. The processes illustrated in FIG. 3 are repeatedly performed in each frame (the frame duration has elapsed). Hereinafter, details of the processes of each function are described along with a flow of the processes. The following processes may be performed by allowing the CPU and the GPU to operate in a coordinated manner.

Firstly, the object position decision section 51 acquires positions and postures of the plurality of objects in the virtual space in this frame on the basis of a signal from the input device and positions, postures, and movements of the plurality of objects in the virtual space in the previous frame (step S101). Then, the object pair searching section 53 searches the combination of the objects having the possibility of a collision (step S102).

FIG. 4 is a diagram illustrating an example of an object subjected to collision determination. For example, the object pair searching section 53 generates determination boxes 34, 35, and 36 that involve each object (the first object 31, the second object 32, and the third object 33) in the virtual space and determines whether or not the determination boxes 34, 35, and 36 are overlapped with each other to thereby find the combination of the objects having the possibility of a collision. The determination boxes 34, 35, and 36 are generally referred to as an axis-aligned bounding box (AABB) and the presence or absence of the mutual overlapping of the determination boxes 34, 35, and 36 is briefly calculated.

Next, the tetrahedron decision section 54 selects a tetrahedron having the possibility of a collision from among the tetrahedrons constituting the object belonging to the combination found by the searching (step S103). For example, the tetrahedron decision section 54 may prepare the AABB into which the determination boxes 34 and 35 of the first object 31 and the second object 32 are further subdivided, as a tree structure of a bounding volume hierarchy (BVH). Then, the tetrahedron decision section 54 may select, from among the BVHs, a tetrahedron that is overlapped with the AABB directly related to a collision. Further, the tetrahedron decision section 54 may perform processing of the object pair searching section 53 and processing for selecting the tetrahedron as a series of processing.

Figure 5:
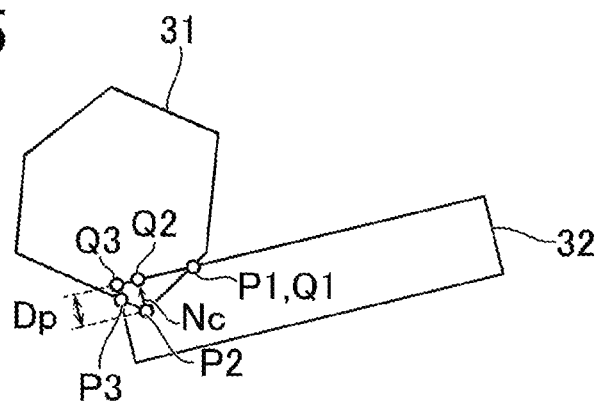
FIG. 5 is a diagram illustrating an example of objects that collide with each other.

FIG. 5 is a diagram illustrating an example of the objects that collide with each other. FIG. 6 is a diagram illustrating an example of the tetrahedron for contact determination. In FIGS. 5 and 6, objects are two-dimensionally described for ease of description; however, the objects and tetrahedrons actually have a three-dimensional shape. A collision normal line Nc in the case in which the first object 31 and the second object 32 collide with each other, contact points P1, P2, and P3 that are set on a surface of the first object 31, contact points Q1, Q2, and Q3 that are set on a surface of the second object 32, and a penetration depth Dp are the same as those in the case in which the first tetrahedron 41 and the second tetrahedron 42 collide with each other. Through this process, in processing of the movement computation section 58 to be hereinafter described, the contact points calculated between the first tetrahedron 41 and the second tetrahedron 42 are treated as the contact points of the first object 31 and the second object 32 and are set as conditions (constraint conditions) for solving the collision between the first object 31 and the second object 32.

When a combination of the tetrahedrons having the possibility of a collision is selected, the collision determination section 52 determines the presence or absence of the collision between the selected tetrahedrons (the first tetrahedron 41 and the second tetrahedron 42) and calculates contact points in the case in which they collide with each other (step S104). The process of step S104 is performed by the separational axis acquisition section 55, the calculation technique selection section 56, and the contact point calculation section 57. Details of the process are described below.

When the contact points are calculated, the movement computation section 58 loosens the constraint conditions for solving the collision in the contact points to thereby calculate a speed change of the first object 31 and the second object 32 in the contact points (step S105). Then, the movement computation section 58 calculates positions and postures (directions) of the objects in accordance with the calculated speed change (step S106). Note that the processes performed by the movement computation section 58 are performed by using a so-called physical calculation and even movements, positions, and postures of objects that do not collide are calculated in accordance with a physical law.

When the positions and postures of the objects are calculated, the image drawing section 59 draws an image of the objects on the basis of the calculated positions and postures (step S107).

Figure 7:
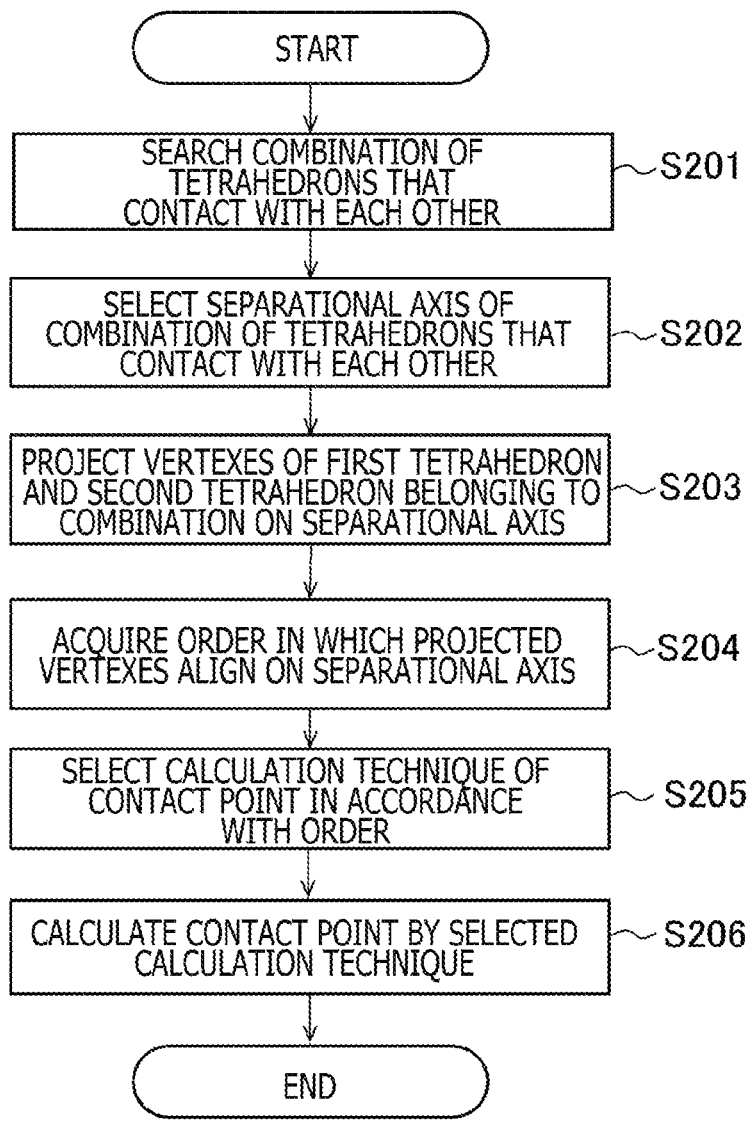
FIG. 7 is a flow chart illustrating processing for determining a collision between tetrahedrons.

Next, in step S104, the process of determining the presence or absence of the collision between the tetrahedrons and calculating the contact points is described. FIG. 7 is a flow chart illustrating the processes of determining the collision between the tetrahedrons.

Firstly, the separational axis acquisition section 55 finds out a combination of tetrahedrons that actually contact with each other from among the combination of the tetrahedrons having the possibility of a collision in step S103 (step S201). Since a tetrahedron has a so-called convex hull, the separational axis acquisition section 55 uses, for example, an inside and outside discrimination algorithm of the convex hull using a Minkowski difference to thereby determine whether or not tetrahedrons belonging to the combination collide with each other. The process of determining the collision between tetrahedrons is known and therefore detailed descriptions are omitted.

Next, the separational axis acquisition section 55 selects the separational axis As of the combination of the tetrahedrons that contact with each other from among the axes as a candidate (step S202). The axis serves as a candidate of the separational axis As is an axis that is geometrically found from shapes of the first tetrahedron 41 and the second tetrahedron 42. For example, the axes as a candidate include axes in directions of normal lines of faces constituting the first tetrahedron 41 and faces constituting the second tetrahedron 42. Further, the axes as a candidate include axes in directions vertical to edges constituting the first tetrahedron 41 and edges constituting the second tetrahedron 42. The axes in directions vertical to the edges constituting the first tetrahedron 41 and the edges constituting the second tetrahedron 42 are found by an outer product of the edges constituting the first tetrahedron 41 and the edges constituting the second tetrahedron 42.

More specifically, the separational axis acquisition section 55 selects, as the separational axis As, an axis in which a length of overlapping of the first tetrahedron 41 and second tetrahedron 42 along the axis is made shortest, from among the axes as a candidate. In other words, the separational axis acquisition section 55 selects an axis in which the collision is eliminated by a least movement as the separational axis As. In an example illustrated in FIG. 5, the separational axis As is indicated by the collision normal line Nc and the movement amount is indicated by the penetration depth Dp.

Note that the separational axis acquisition section 55 may acquire the separational axis As by using other methods. In this case, the separational axis acquisition section 55 may not determine the presence or absence of the contact in this stage.

Next, the calculation technique selection section 56 projects the vertexes of the first tetrahedron 41 and vertexes of the second tetrahedron 42 belonging to the combination on the separational axis As (step S203). Then, the calculation technique selection section 56 acquires an order in which the projected vertexes of the first tetrahedron 41 and vertexes of the second tetrahedron 42 align on the separational axis As (step S204).

Figure 8:
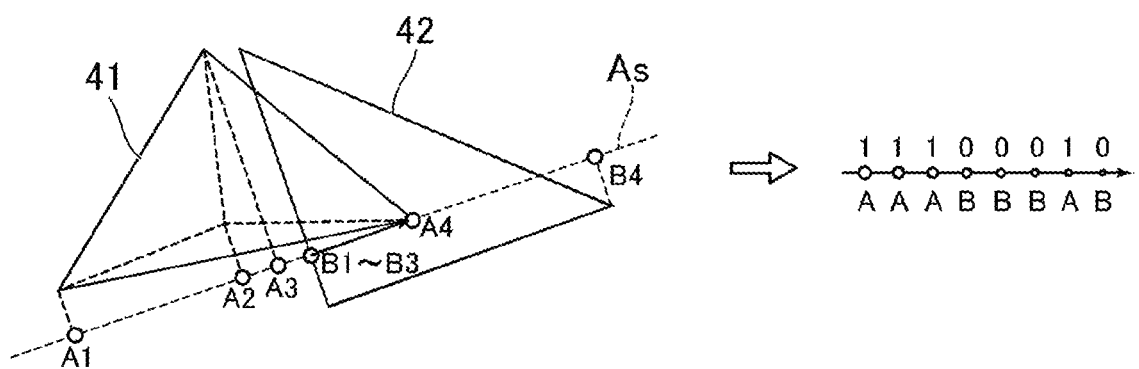
FIG. 8 is a diagram illustrating a relationship between vertexes of two tetrahedrons and a separational axis and a bit pattern indicating an alignment of the vertexes on the separational axis.

FIG. 8 is a diagram illustrating a relationship between vertexes of two tetrahedrons and the separational axis As and a bit pattern indicating an alignment of the vertexes on the separational axis As. In an example illustrated in FIG. 8, the vertexes of the first tetrahedron 41 are projected as points A1 to A4 on the separational axis As and the vertexes of the second tetrahedron 42 are projected as points B1 to B4 on the separational axis As. FIG. 8 illustrates an example in the case in which a normal line of a face on the left side of the second tetrahedron 42 is used as the separational axis As, and therefore the points B1 to B3 are projected on the same position.

More specifically, the calculation technique selection section 56 prepares a pattern indicating an order in which symbols corresponding to the vertexes arranged on the separational axis As align and the vertexes align on the separational axis As. Only the fact that the vertex belongs to the first tetrahedron 41 or the second tetrahedron 42 becomes an issue in the following process. Therefore, in the pattern of the symbols, the symbol itself indicates that the vertex corresponding to the symbol belongs to the first tetrahedron 41 or the second tetrahedron 42. Further, an order of the symbols corresponds to an order in which the vertex corresponding to the symbol is arranged on the separational axis As. Here, the calculation technique selection section 56 prepares a pattern as the symbols, serving as one the projected vertex belonging to the first tetrahedron 41 and serving as zero the projected vertex belonging to the second tetrahedron 42. Therefore, hereinafter, a pattern of the symbols is described as a bit pattern. In an example illustrated in FIG. 8, a bit pattern such that "11100010" is represented by a binary digit is generated. Note that the calculation technique selection section 56 may prepare a pattern serving as zero the projected vertex belonging to the first tetrahedron 41 and serving as one the projected vertex belonging to the second tetrahedron 42.

Then, the calculation technique selection section 56 selects the calculation technique for the contact point on the basis of the order in which the projected vertexes align on the separational axis As (step S205). More specifically, the calculation technique selection section 56 determines a type of a collision on the basis of the pattern of the symbols and selects the calculation technique for the contact point in accordance with the determined type of a collision.

Figure 9A:
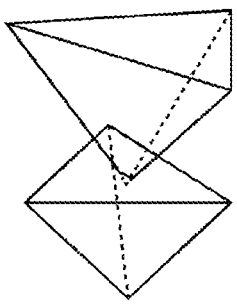
Figure 9B:
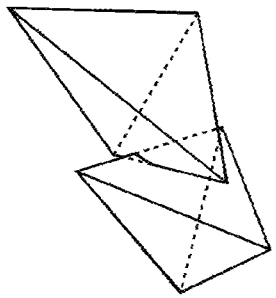

FIGS. 9A to 9D are diagrams illustrating the type of a collision. The types of a collision classified in the present embodiment include a collision type VF, a collision type EE, a collision type EF, a collision type FF, a collision type VV, and a collision type VE. The collision type VF is illustrated in FIG. 9A and indicates a case in which a vertex of one tetrahedron and a face of another tetrahedron collide with each other. The collision type EE is illustrated in FIG. 9B and indicates a case in which an edge of one tetrahedron and an edge of another tetrahedron collide with each other. The collision type EF is illustrated in FIG. 9C and indicates a case in which an edge of one tetrahedron and a face of another tetrahedron collide with each other. The collision type FF is illustrated in FIG. 9D and indicates a case in which a face of one tetrahedron and a face of another tetrahedron collide with each other. The collision type VV is not illustrated and indicates a case in which a vertex of one tetrahedron and a vertex of another tetrahedron collide with each other. The collision type VE is not illustrated and indicates a case in which a vertex of one tetrahedron and an edge of another tetrahedron collide with each other.

The calculation technique for the contact point and the number of the calculated contact points differ in accordance with the type of a collision. The number of the contact points calculated by the calculation technique selected in accordance with the collision type VF, the collision type VV, and the collision type VE is one, the number of the contact points calculated by the calculation technique selected in accordance with the collision type EE is one, the number of the contact points calculated by the calculation technique selected in accordance with the collision type EF is two, and the number of the contact points calculated by the calculation technique selected in accordance with the collision type FF is three to six.

A relationship between the type of a collision and the bit pattern is further described. FIGS. 10A and 10B are diagrams illustrating two other examples of the bit patterns. In an example illustrated in FIG. 10A, one bit "1" and two consecutive bits "0" are present inside the bit pattern. This indicates that one vertex of the first tetrahedron 41 and a group of two vertexes of the second tetrahedron 42 are intersected with each other. On the basis of the above, the calculation technique selection section 56 determines an example illustrated in FIG. 10A as the collision type VE. On the other hand, in an example illustrated in FIG. 10B, even if the inside of the bit pattern is viewed, both the vertexes repeatedly appear and the relationship is hard to understand. However, one bit "1" and two bits "0" are present in outermost parts of the bit pattern in an example illustrated in FIG. 10B. It may be considered that the vertex of the first tetrahedron 41 and the edge of the second tetrahedron 42 are present on the outside. By contrast, it may be considered that the face of the first tetrahedron 41 and the edge of the second tetrahedron 42 are present on the inside. On the basis of the above, the calculation technique selection section 56 determines an example illustrated in FIG. 10B as the collision type EF.

In the actual process, a table indicating correspondence between the bit pattern and the type of a collision is previously prepared. The calculation technique selection section 56 determines the type of a collision corresponding to the bit pattern by using the table and selects the calculation technique.

FIG. 11 is a diagram illustrating the correspondence between the bit pattern and the type of a collision. The bit patterns are described on the left side of FIG. 11 and the types of collisions are described on the right side. A bit pattern "11110000" is a special pattern in which a collision does not occur. When the processes are performed in accordance with the flow illustrated in FIG. 7, the bit pattern is never generated. A description of A in "A versus B" in the description of the type of a collision described on the right side of FIG. 11 indicates a portion in which the first tetrahedron 41 collides and a description of B indicates a portion in which the second tetrahedron 42 collides. For example, "Vertex versus Edge" and "Edge versus Vertex" indicate the collision type VE and "Vertex versus Vertex" indicates the collision type VV.

When the calculation technique for the contact point is selected, the contact point calculation section 57 calculates the contact points by using the selected calculation technique (step S206). In the collision type VF, for example, the contact points can be calculated by using a known technique on the basis of a vertex of a tetrahedron in which the vertex collides and the collision normal line Nc. Even in the collision type EE, the contact points can be calculated by using the known technique in the similar manner.

Hereinafter, the calculation technique for the contact points in the case of the collision type FF is described. FIGS. 12A to 12C are diagrams describing an example of the calculation technique for the contact points. In the collision type FF, as illustrated in FIG. 12A, a face of one tetrahedron and a face of another tetrahedron collide with each other. The contact point calculation section 57 projects individually the face of the first tetrahedron 41 and the face of the second tetrahedron 42 relating to the collision on a face (separate plane) vertical to the separational axis As (P1). The contact point calculation section 57 finds out a point (intersection) in which edges of the face projected on the separate plane are intersected with each other by using a format of a center of gravity coordinate in FIG. 12B. Then, the contact point calculation section 57 re-projects the found-out intersection on a three-dimensional face (P2) and calculates the re-projected point as the contact point.

Even in other types of collisions, the contact point can be calculated by using a technique similar to the above technique or the known technique.

In this manner, the types of collisions are classified and the calculation technique for the contact point is applied in accordance with the classified type of a collision, and thereby the number of the calculated contact points and the calculation amount in a calculation of the contact point can be reduced as a whole. Further, the number of the found-out contact points is reduced, and thereby even the calculation amount in the case of loosening constraint relating to a collision of objects can be reduced. Note that branching of the processes is small as compared to determination of the presence or absence of the collision and calculation of the contact points in a general polyhedron. Therefore, even if the calculation amount itself becomes enormous as compared to the polyhedron, calculation can be performed at high speed by using a processor that is good at parallel computation like a GPU.

The present disclosure contains subject matter related to that disclosed in Japanese Priority Patent Application JP 2017-212536 filed in the Japan Patent Office on Nov. 2, 2017, the entire content of which is hereby incorporated by reference.

It should be understood by those skilled in the art that various modifications, combinations, sub-combinations and alterations may occur depending on design requirements and other factors insofar as they are within the scope of the appended claims or the equivalent thereof.

What is claimed is:

1. An image processing apparatus comprising:
a position acquisition section configured to acquire a position of a first tetrahedron and a position of a second tetrahedron in a virtual space;
a separational axis acquisition section configured to acquire a separational axis extending in a direction from the first tetrahedron to the second tetrahedron;
a technique selection section configured to project a vertex of the first tetrahedron and a vertex of the second tetrahedron on the separational axis and select a calculation technique for a contact point on a basis of an order in which the projected vertex of the first tetrahedron and vertex of the second tetrahedron align on the separational axis;
a contact point calculation section configured to calculate one or a plurality of contact points between the first tetrahedron and the second tetrahedron by the selected calculation technique; and
an image drawing section configured to draw an image on the basis of the calculated contact point.

2. The image processing apparatus according to claim 1, wherein
the calculation technique is provided in plurality, and a number of the calculated contact points differs in accordance with the plurality of calculation techniques.

3. The image processing apparatus according to claim 1, wherein
by one of the plurality of calculation techniques, one contact point is calculated in a collision between a vertex included in one and a face included in another of the first tetrahedron and the second tetrahedron.

4. The image processing apparatus according to claim 1, wherein
by one of the plurality of calculation techniques, two contact points are calculated in a collision between an edge included in one and a face included in another of the first tetrahedron and the second tetrahedron.

5. The image processing apparatus according to claim 1, wherein
the separational axis acquisition section selects a separational axis from a plurality of candidates geometrically found on the basis of a shape of the first tetrahedron and a shape of the second tetrahedron.

6. The image processing apparatus according to claim 5, wherein
the plurality of candidates include an axis in a direction of a normal line of a face constituting the first tetrahedron and a face constituting the second tetrahedron.

7. The image processing apparatus according to claim 5, wherein
the plurality of candidates include an axis in a direction vertical to an edge of the first tetrahedron and an edge of the second tetrahedron.

8. The image processing apparatus according to claim 1, the first tetrahedron constituting a portion of a first object, the second tetrahedron constituting a portion of a second object,
the image processing apparatus further comprising:
a movement calculation section configured to calculate a movement of the first object and a movement of the second object on the basis of the calculated contact point, wherein
the image drawing section draws an image of the first object and an image of the second object on the basis of the calculated movement of the first object and the movement of the second object.

9. An image processing method comprising:
acquiring a position of a first tetrahedron and a position of a second tetrahedron in a virtual space;
acquiring a separational axis extending in a direction from the first tetrahedron to the second tetrahedron;
projecting a vertex of the first tetrahedron and a vertex of the second tetrahedron on the separational axis and selecting a calculation technique for a contact point on a basis of an order in which the projected vertex of the first tetrahedron and vertex of the second tetrahedron align on the separational axis;
calculating one or a plurality of contact points between the first tetrahedron and the second tetrahedron by the selected calculation technique; and
drawing an image on the basis of the calculated contact point.

10. A non-transitory computer readable medium having stored thereon a program for a computer, the program comprising:
by a position acquisition section, acquiring a position of a first tetrahedron and a position of a second tetrahedron in a virtual space;
by a separational axis acquisition section, acquiring a separational axis extending in a direction from the first tetrahedron to the second tetrahedron;
by a technique selection section, projecting a vertex of the first tetrahedron and a vertex of the second tetrahedron on the separational axis and selecting a calculation technique for a contact point on a basis of an order in which the projected vertex of the first tetrahedron and vertex of the second tetrahedron align on the separational axis;
by a contact point calculation section, calculating one or a plurality of contact points between the first tetrahedron and the second tetrahedron by the selected calculation technique; and
by an image drawing section, drawing an image on the basis of the calculated contact point.

* * * * *